(12) United States Patent
Higashihama et al.

(10) Patent No.: US 6,977,518 B2
(45) Date of Patent: Dec. 20, 2005

(54) ELECTRICAL LEAK DETECTING APPARATUS

(75) Inventors: Hirotada Higashihama, Ikoma (JP); Hisashi Usui, Hirakata (JP); Koji Soshin, Toyonaka (JP); Toshiaki Saito, Hirakata (JP); Yoji Minami, Nagoya (JP)

(73) Assignee: Matsushita Electric Works, Ltd., Osaka (JP)

(*) Notice: Subject to any disclaimer, the term of this patent is extended or adjusted under 35 U.S.C. 154(b) by 0 days.

(21) Appl. No.: 10/694,880

(22) Filed: Oct. 29, 2003

(65) Prior Publication Data
US 2004/0227521 A1 Nov. 18, 2004

(30) Foreign Application Priority Data
Nov. 11, 2002 (JP) .............................. 2002-327388
May 19, 2003 (JP) .............................. 2003-140991
May 19, 2003 (JP) .............................. 2003-140992

(51) Int. Cl.[7] ............................................ G01R 31/36
(52) U.S. Cl. ..................................... 324/771; 324/500
(58) Field of Search .............................. 324/771, 763, 324/158.1

(56) References Cited
U.S. PATENT DOCUMENTS
6,002,215 A * 12/1999 Yamashita et al. .......... 315/308

6,246,248 B1 * 6/2001 Yamagishi ................... 324/763
6,320,389 B1  11/2001 Tamesue et al.
6,833,708 B2 * 12/2004 Furukawa ................... 324/426

FOREIGN PATENT DOCUMENTS
JP   57-119263     7/1982
JP   60-262069    12/1985
JP   11-218554    8/1999
JP   3307173     5/2002

OTHER PUBLICATIONS
English Language Abstract of JP 3307173.
English language Abstract of JP 57-119263.
English language Abstract of JP 60-262069.
English language Abstract of JP 11-218554.

* cited by examiner

Primary Examiner—Paresh Patel
(74) Attorney, Agent, or Firm—Greenblum & Bernstein, P.L.C.

(57) ABSTRACT

An electrical leak detecting apparatus for detecting electrical leak of a power supply device includes two voltage division elements which have an identical impedance value and are connected to each other in series between input terminals or output terminals of a DC/AC conversion circuit of the power supply device, a detection element which has one end connected to a junction of the voltage division elements, a capacitor which is inserted between the other end of the detection element and ground and a decision member which receives a voltage drop across the detection element as a detection signal and processes the detection signal so as to judge occurrence of the electrical leak.

11 Claims, 15 Drawing Sheets

ELECTRICAL LEAK DETECTING APPARATUS

BACKGROUND OF THE INVENTION

1. Field of the Invention

The present invention relates to an electrical leak detecting apparatus for detecting electrical leak of a power supply device.

2. Description of the Prior Art

One example of conventional electrical leak detecting apparatuses is shown in FIG. 20. In this prior art electrical leak detecting apparatus, voltage division resistance elements R1 and R2 each having a high resistance value are connected to each other in series between output terminals of a DC power supply E acting as a mechanical power source of an electric vehicle and a detection resistance element R3 is connected between a junction of the voltage division resistance elements R1 and R2 and ground (vehicle body) such that electrical leak is detected by fetching, as a detection voltage, a voltage drop occurring between opposite ends of the detection resistance element R3 as disclosed in, for example, Japanese Patent No. 3307173 (2002).

The prior art electrical leak detecting apparatus is operated as follows. Since the DC power supply E used as the mechanical power source of the electric vehicle outputs a quite high voltage of about 200 to 300 V, the DC power supply E is electrically isolated from the vehicle body, i.e., is in a floating state such that a man does not receive an electric shock even if the man comes into contact with the vehicle body. However, in case dielectric breakdown happens between a high voltage system including the DC power supply E and ground, the man may receive an electric shock through establishment of a current path upon contact of the man with the vehicle body or the like. On the other hand, since the high voltage system is isolated from ground, electric current does not flow unless the man comes into contact with the high voltage system even if the dielectric breakdown happens, so that it is impossible to detect electrical leak. Thus, the prior art electrical leak detecting apparatus is adapted to detect electrical leak prior to contact of the man with the high voltage system.

FIG. 21 shows a state of the above prior art electrical leak detecting apparatus, in which dielectric breakdown happens between a negative polarity of the high voltage system and ground and a man is held in contact with the high voltage system. In FIG. 21, a resistance r represents a resistance at a location of the dielectric breakdown between the high voltage system and ground, i.e., a dielectric breakdown resistance and a resistance R represents a resistance of a human body. It is supposed here that the DC power supply E has an output voltage V and the voltage division resistance elements R1 and R2, the detection resistance element R3, the dielectric breakdown resistance r and the human body resistance R have resistance values R1, R2, R3, r and R, respectively. If the resistance values R1 and R2 of the voltage division resistance elements R1 and R2 are far larger than the resistance value r of the dielectric breakdown resistance r, a leakage current (ground fault current) I flowing through the human body resistance R is expressed by the following equation (1).

$$I = V/(r+R) \tag{1}$$

Meanwhile, the human body resistance R may vary according to environments such as humidity. In case the human body resistance R is set to zero, the leakage current I reaches a maximum.

On the other hand, if a detection voltage V1 across opposite ends of the detection resistance element R3 at the time the man is held out of contact with the high voltage system, namely, the resistance value R of the human body resistance R is infinite is obtained on the supposition that the resistance values R1 and R2 of the voltage division resistance elements R1 and R2 are larger than the resistance value R3 of the detection resistance element R3, a leakage current i flowing through the voltage division resistance element R1, the detection resistance element R3 and the dielectric breakdown resistance r via ground is expressed by the following equation (2) and the detection voltage V1 across the opposite ends of the detection resistance element R3 is given by the following equation (3).

$$i = V/(R1+R3+r) \tag{2}$$

$$V1 = V \times R3/(R1+R3+r) \tag{3}$$

Since the detection voltage V1 corresponding to the leakage current I is obtained by substituting the equation (1) for the equation (3), electrical leak can be detected from this detection voltage V1.

In the above prior art electrical leak detecting apparatus, since presence or absence of occurrence of electrical leak can be detected but a location of occurrence of electrical leak cannot be detected, it is difficult to promptly take a proper countermeasure against electrical leak.

Furthermore, in the above prior art electrical leak detecting apparatus, in case dielectric breakdown happens in a transformer for insulating an input side and an output side of a DC/DC conversion circuit of a power supply device (not shown), other appliances connected to the DC power supply E may be damaged upon application of a high voltage of a secondary winding of the transformer to a primary winding of the transformer.

SUMMARY OF THE INVENTION

Accordingly, an essential object of the present invention is to provide, with a view to eliminating the above mentioned drawbacks of prior art, an electrical leak detecting apparatus for detecting electrical leak of a power supply device, in which not only presence or absence of occurrence of electrical leak and a location of occurrence of electrical leak can be detected but a withstand voltage of an output side of a DC/DC conversion circuit of the power supply device and safety of the power supply device can be upgraded.

In order to accomplish this object of the present invention, an electrical leak detecting apparatus according to the present invention detects electrical leak of a power supply device including a DC/DC conversion circuit in which a DC voltage supplied from a DC power supply is chopped and boosted to a desired level by an insulated transformer so as to be outputted through its rectification and smoothing and a DC/AC conversion circuit for converting into an AC voltage the DC voltage outputted from the DC/DC conversion circuit. The power supply device is operated in a state of electrical insulation from ground so as to supply the AC voltage to a load. The electrical leak detecting apparatus includes two voltage division elements which have an identical impedance value and are connected to each other in series between input terminals or output terminals of the DC/AC conversion circuit. A detection element has one end connected to a junction of the voltage division elements. A capacitor is inserted between the other end of the detection element and the ground. A decision means receives a voltage drop across the detection element as a detection signal and processes the detection signal so as to judge occurrence of the electrical leak.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
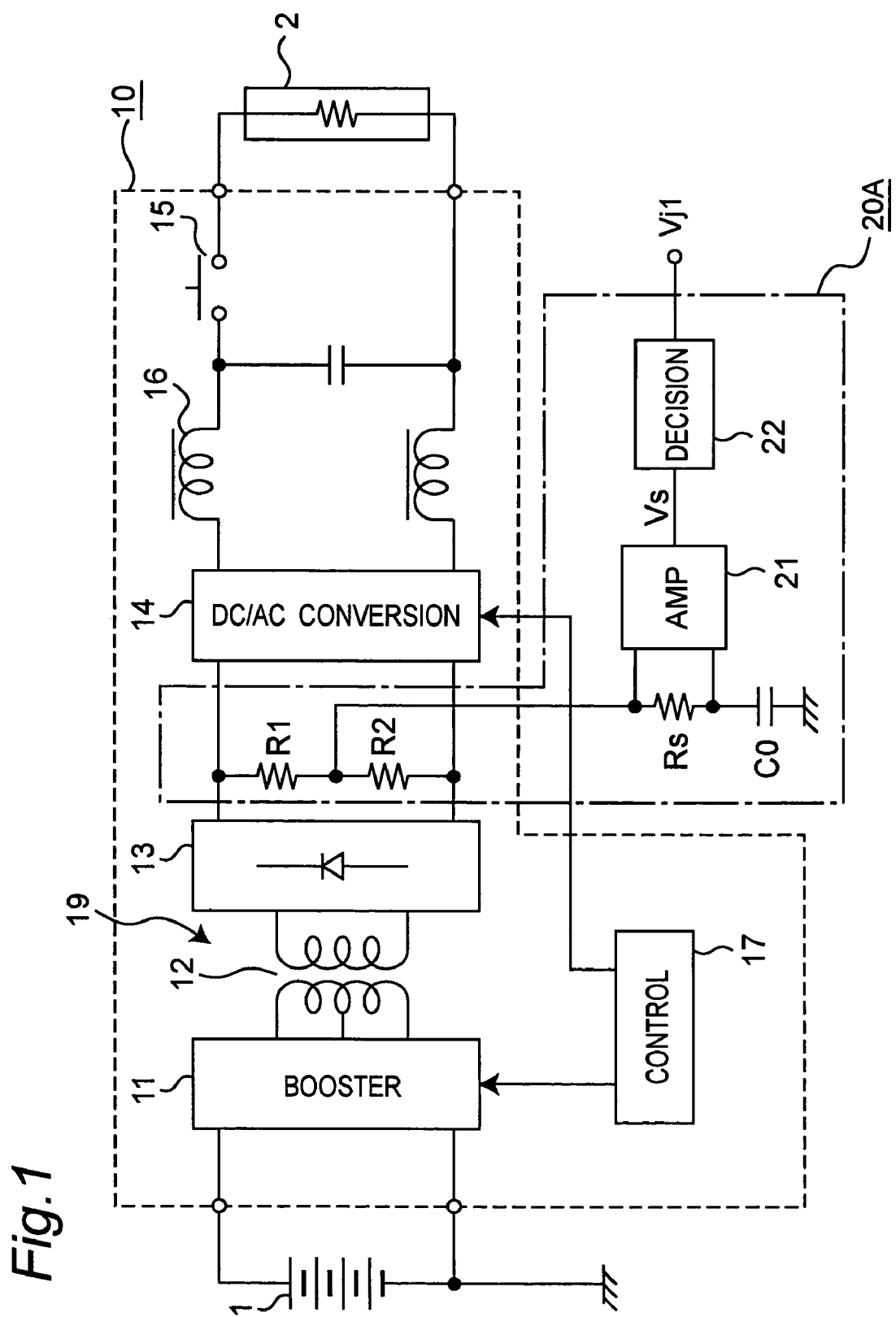
FIG. 1 is a block circuit diagram showing an electrical leak detecting apparatus according to a first embodiment of the present invention and a power supply device.

FIG. 1 shows an electrical leak detecting apparatus 20A according to a first embodiment of the present invention, which is used for a power supply device 10. The power supply device 10 is mounted on a motor vehicle and produces an AC voltage of 100 V from a battery 1 of a low voltage of, for example, 12 to 42 V so as to supply the AC voltage to a load 2. The battery 1 is connected to ground (vehicle body). The power supply device 10 includes a DC/DC conversion circuit 19, a DC/AC conversion circuit 14 for converting into an AC voltage of sine wave a DC voltage outputted from the DC/DC conversion circuit 19, a switch member 15 for opening or closing a power supply path from the DC/AC conversion circuit 14 to the load 2, a filter 16 for removing a harmonic component from an output of the DC/AC conversion circuit 14 and a power supply control circuit 17 for controlling operation of the DC/DC conversion circuit 19 and the DC/AC conversion circuit 14.

The DC/DC conversion circuit 19 includes a booster circuit 11, an insulated transformer 12 and a rectifier circuit 13 including a smoothing circuit. In the DC/DC conversion circuit 19, a DC voltage supplied from the battery 1 is subjected to chopping by a switching element of the booster circuit 11 and is raised to a desired level by the insulated transformer 12. Then, the DC voltage is outputted through rectification and smoothing by the rectifier circuit 13. The DC/DC conversion circuit 19 is formed by a known insulated DC/DC converter and can raise the input voltage to the desired level when the power supply control circuit 17 adjusts a switching frequency and an on-duty ratio of the switching element of the booster circuit 11. Meanwhile, the DC/AC conversion circuit 14 is formed by, for example, a known full bridge type inverter circuit. By adjusting a switching frequency and an on-duty ratio of a switching element of the inverter circuit, the DC voltage outputted from the rectifier circuit 13 can be converted into the AC voltage of sine wave having a predetermined frequency of, for example, 50 Hz or 60 Hz by the DC/AC conversion circuit 14. Meanwhile, since the power supply control circuit 17 may be formed by a microcomputer but a concrete configuration of the power supply control circuit 17 is known, description of the power supply control circuit 17 is abbreviated.

On the other hand, as shown in FIG. 1, the electrical leak detecting apparatus 20A of the present invention includes two voltage division resistance elements R1 and R2 connected to each other in series between input terminals of the DC/AC conversion circuit 14 and having an identical resistance value, a detection resistance element Rs having one end connected to a junction of the voltage division resistance elements R1 and R2, a capacitor C0 inserted between the other end of the detection resistance element Rs and ground, an amplifier 21 which fetches a voltage drop across the detection resistance element Rs as a detection signal Vs so as to adjust gain of the detection signal Vs and a first decision unit 22 which process the detection signal Vs so as to judge occurrence of electrical leak. In this embodiment, by inserting the capacitor C0 between the detection resistance element Rs and ground, the electrical leak detecting apparatus 20A is insulated from ground in terms of DC.

Figure 2:
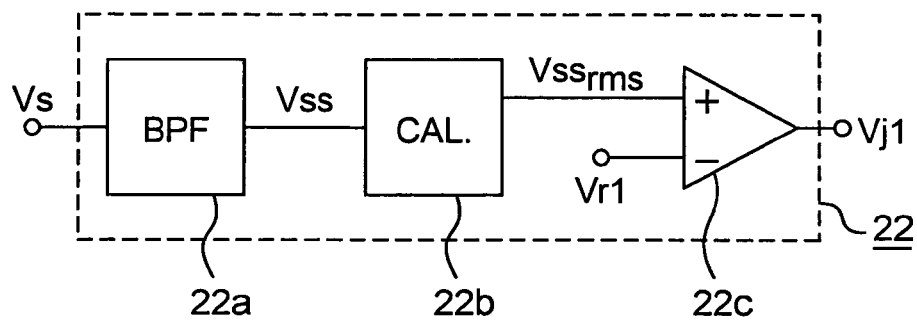
FIG. 2 is a block diagram of a first decision unit employed in the electrical leak detecting apparatus of FIG. 1.

As shown in FIG. 2, the first decision unit 22 includes a band-pass filter 22a for fetching only a frequency component included in the detection signal Vs and having a frequency substantially equal to the frequency of, for example, 50 Hz or 60 Hz of the sine wave AC voltage, a calculating portion 22b for calculating an effective value $Vss_{rms}$ of a detection signal Vss which has passed through the band-pass filter 22a and a comparator 22c for comparing the effective value $Vss_{rms}$ from the calculating portion 22b with a predetermined threshold value Vr1. When the effective value $Vss_{rms}$ of the detection signal Vss has exceeded the threshold value Vr1, the first decision unit 22 outputs a decision signal Vj1 by judging that electrical leak occurs. However, also if the detection signal Vs is subjected to full-wave rectification and then, is smoothed by an integral circuit such that a DC detection signal Vss2 is generated in the same manner as calculation of the above effective value, it is possible to judge occurrence of electrical leak.

In this embodiment, since a secondary winding of the insulated transformer 12 of the power supply device 10 is isolated from ground, namely, is in a floating state, dark current does not flow through the detection resistance element Rs unless an electrical leak accident does not happen, so that the detection signal Vs is also not outputted. However, in case dielectric breakdown has occurred between the power supply device 10 and ground, leakage current flows through the detection resistance element Rs, so that the first decision unit 22 judges that electrical leak occurs.

Figure 3:
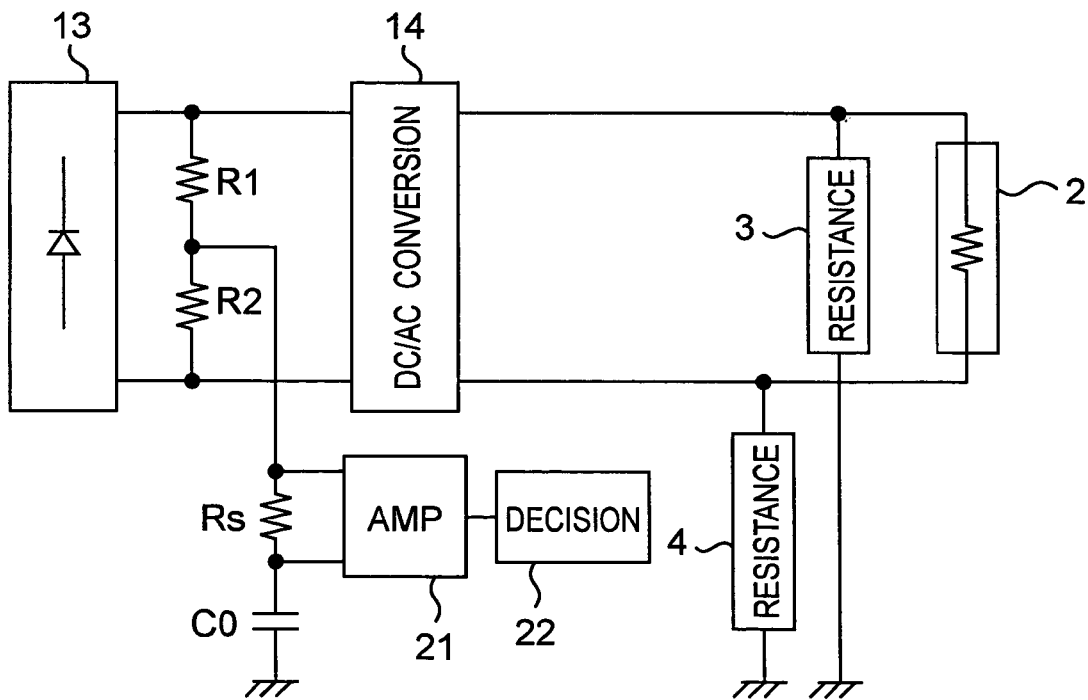
FIG. 3 is a view explanatory of operation of the first decision unit of FIG. 2.
Figure 4:
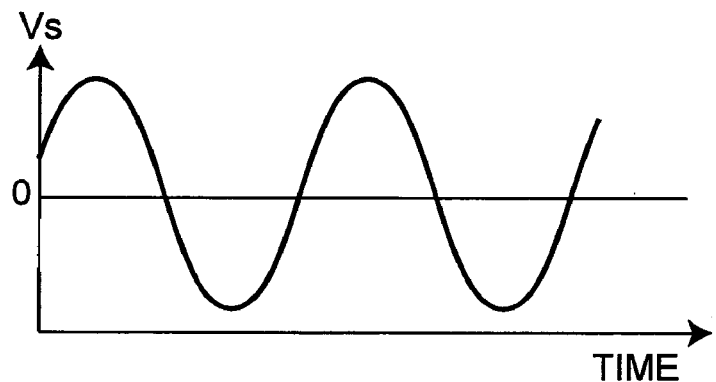
FIG. 4 is a waveform chart of the first decision unit of FIG. 2.

As shown in FIG. 3, a case is considered in which dielectric breakdown has occurred between a power supply path from the power supply device 10 to the load 2 and ground. In FIG. 3, reference numeral 3 denotes a dielectric breakdown resistance or a human body resistance at the time the dielectric breakdown has occurred at a positive polarity of the power supply path, while reference numeral 4 denotes a dielectric breakdown resistance or a human body resistance at the time the dielectric breakdown has occurred at a negative polarity of the power supply path. In this case, leakage current flows through the dielectric breakdown resistance 3 or 4 and the detection resistance element Rs and the voltage division resistance element R1 or R2 via ground and the detection voltage Vs is generated across the detection resistance element Rs. At this time, the detection voltage Vs is a sine wave AC voltage having a frequency equal to that of the sine wave AC voltage outputted from the power supply device 10 as shown in FIG. 4. However, in dependence of whether the leakage current flows through the dielectric breakdown resistance 3 or the dielectric breakdown resistance. 4, a phase of the detection voltage Vs may not coincide with that of the output voltage of the power supply device 10. In the first decision unit 22, the frequency component equal to the frequency of the output voltage of the power supply device 10 is fetched by the band-pass filter 22a and the effective value $Vss_{rms}$ of the detection signal Vss having passed through the band-pass filter 22a is calculated by the calculating portion 22b. Then, the effective value $Vss_{rms}$ calculated by the calculating portion 22b is compared with the predetermined threshold value Vr1 by the comparator 22c. When the the effective value $Vss_{rms}$ of the detection signal Vss has exceeded the threshold value Vr1, the decision signal Vj1 is outputted by judging that electrical leak occurs.

In this embodiment, since an output side of the DC/DC conversion circuit 19 is insulated from ground in terms of DC by inserting the capacitor C0 between the detection resistance element Rs and ground, withstand voltage of the output side of the DC/DC conversion circuit 19 relative to ground can be raised and high voltage of the secondary winding of the insulated transformer 12 is not applied to a primary winding of the insulated transformer 12 even if dielectric breakdown happens in the insulated transformer 12, thereby resulting in enhancement of safety of the power supply device 10.

Figure 5:
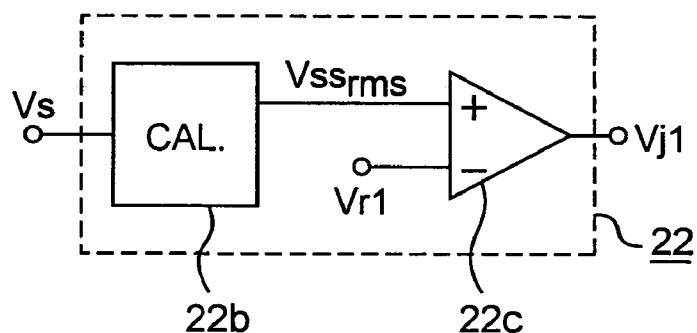
FIG. 5 is a block diagram of the first decision unit of FIG. 2 in case the power supply device of FIG. 1 outputs an AC voltage of rectangular wave.
Figure 6:
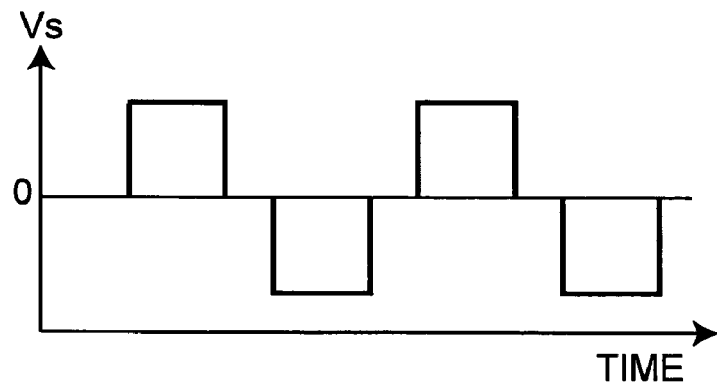
FIG. 6 is a waveform chart of the AC voltage of rectangular wave in FIG. 5.

Meanwhile, in case the power supply device 10 outputs AC voltage of rectangular wave instead of AC voltage of sine wave, the detection voltage Vs becomes AC voltage of rectangular wave having a frequency identical with that of the AC voltage of rectangular wave outputted by the power supply device 10 as shown in FIG. 6, so that the first decision unit 22 may be formed by only the calculating portion 22b and the comparator 22c by deleting the band-pass filter 22a therefrom as shown in FIG. 5. In the power supply device 10 which outputs AC voltage of rectangular wave, since DC voltage may be converted into the AC voltage of rectangular wave by periodically inverting polarity of output voltage of the DC/DC conversion circuit 19 by the DC/AC conversion circuit 14 formed by the full bridge type inverter circuit, only on-period of the switching element of the inverter circuit may be adjusted without the necessity to perform pulse width modulation (PWM) control of the switching element of the inverter circuit in conversion of DC voltage into AC voltage of sine wave, so that control in the power supply control circuit 17 is quite simplified. Meanwhile, in case the DC/AC conversion circuit 14 is arranged to output AC voltage of rectangular wave, the filter 16 is not required to be provided.

(Second Embodiment)

Figure 7:
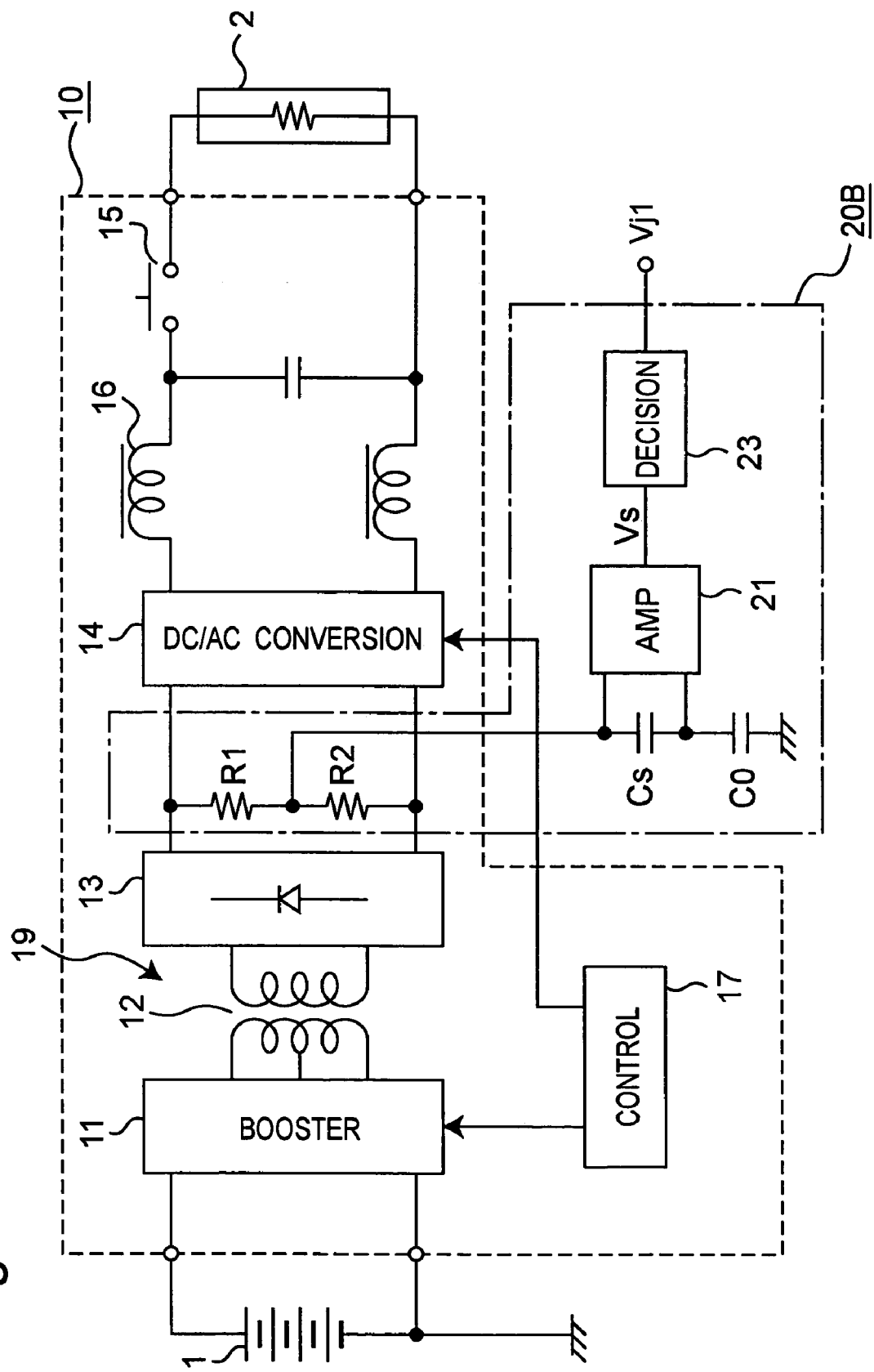
FIG. 7 is a block circuit diagram showing an electrical leak detecting apparatus according to a second embodiment of the present invention and the power supply device of FIG. 1.

FIG. 7 shows an electrical leak detecting apparatus 20B according to a second embodiment of the present invention, which is used for the power supply device 10. When the electrical leak detecting apparatus 20B is compared with the electrical leak detecting apparatus 20A of the first embodiment of the present invention, the detection resistance element Rs of the electrical leak detecting apparatus 20A is replaced by a capacitor Cs acting as a detection element and the first decision unit 22 of the electrical leak detecting apparatus 20A is replaced by a second decision unit 23. Since other configurations of the electrical leak detecting apparatus 20B are similar to those of the electrical leak detecting apparatus 20A of FIG. 1, the description is abbreviated for the sake of brevity.

Figure 8:
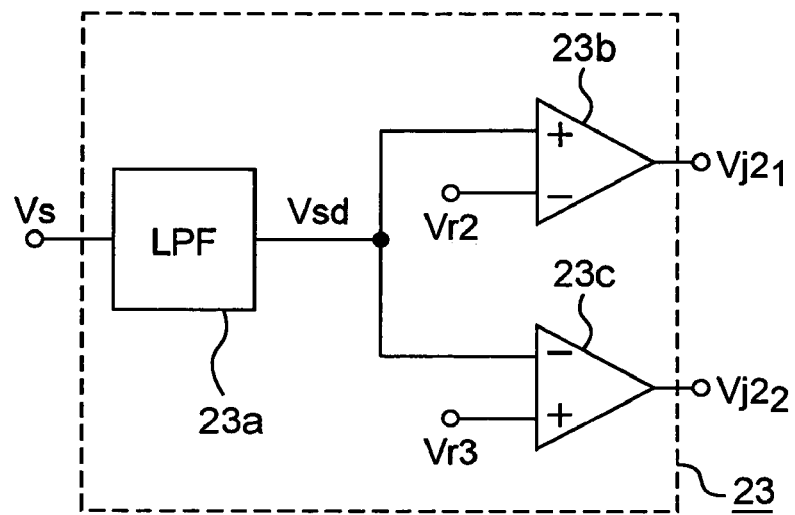
FIG. 8 is a block diagram of a second decision unit employed in the electrical leak detecting apparatus of FIG. 7.

As shown in FIG. 8, the second decision unit 23 includes a low-pass filter 23a for fetching only a DC component of the detection signal Vs, a first comparator 23b for comparing with a predetermined threshold value Vr2 a detection signal Vsd which has passed through the low-pass filter 23a and a second comparator 23c for comparing the detection signal Vsd from the the low-pass filter 23a with a predetermined threshold value Vr3. The threshold values Vr2 and Vr3 have an identical absolute value but opposite signs, respectively. When the detection value Vsd has exceeded the threshold value Vr2 or Vr3, a decision signal $Vj2_1$ or $Vj2_2$ is outputted by judging that electrical leak occurs.

Figure 9:
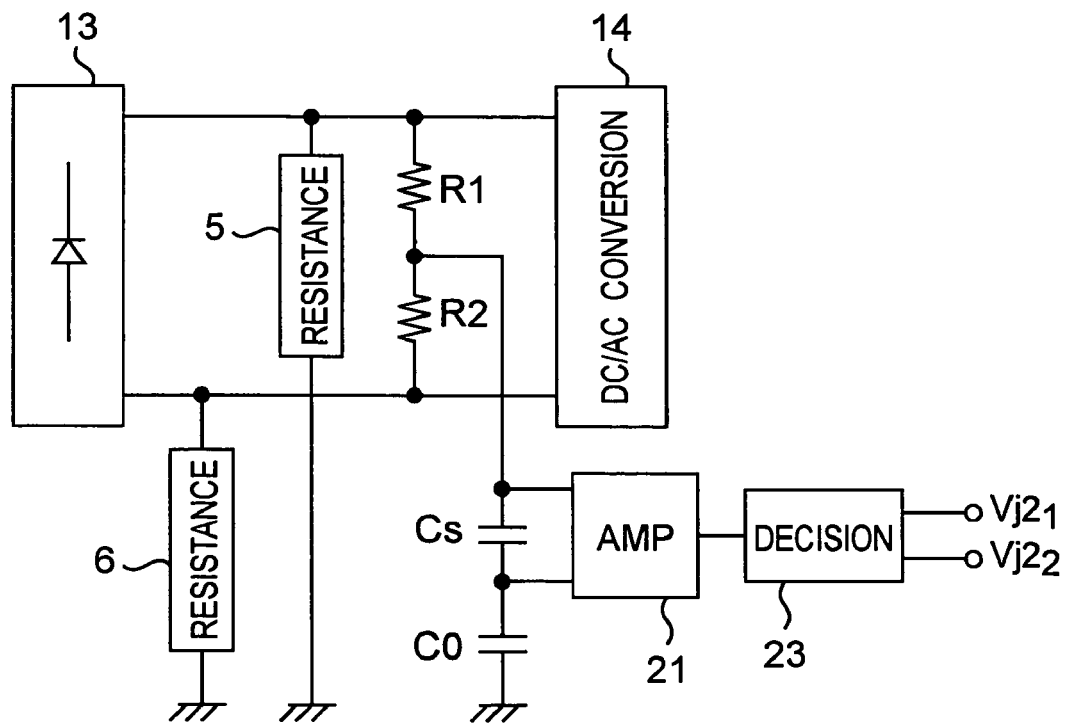
FIG. 9 is a view explanatory of operation of the second decision unit of FIG. 8.
Figure 10A:
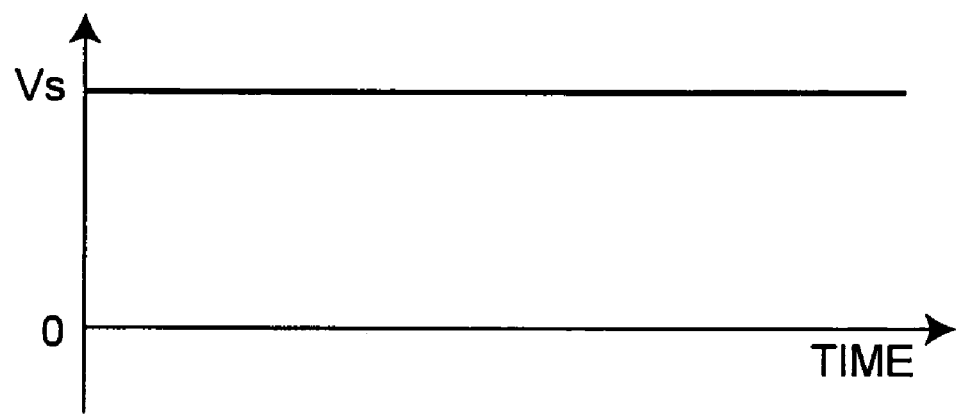
FIGS. 10A and 10B are waveform charts of the second decision unit of FIG. 7.
Figure 10B:
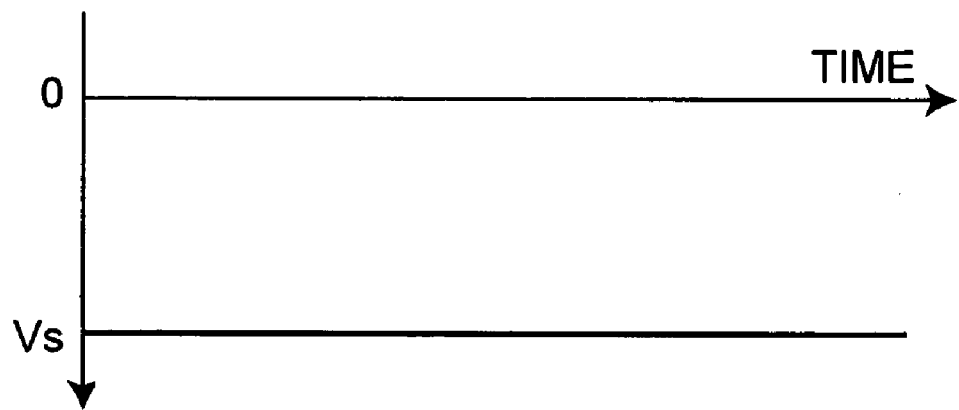

As shown in FIG. 9, a case is considered in which electrical leak due to dielectric breakdown (defective insulation) has occurred between the rectifier circuit 13 and the DC/AC conversion circuit 14 in the power supply device 10. In FIG. 9, reference numeral 5 denotes a dielectric breakdown resistance between a power supply path of positive polarity and ground, while reference numeral 6 denotes a dielectric breakdown resistance between a power supply path of negative polarity and ground. In this case, although a current path exists in which leakage current flows through the dielectric breakdown resistance 5 or 6 and the capacitor Cs and the voltage division resistance element R1 or R2 via ground, the capacitors Cs and Co are inserted into this current path and thus, DC leakage current does not flow through this current path. However, in case at least one of output lines of the DC/DC conversion circuit 19 insulated from ground is grounded by way of the dielectric breakdown resistance 5 or 6, the detection capacitor Cs is charged by the leakage current and thus, a potential difference (detection voltage Vs) is generated between opposite ends of the capacitor Cs. At this time, the detection voltage Vs becomes DC voltage shown in FIGS. 10A and 10B and polarity of the detection voltage Vs changes in accordance with a location of occurrence of electrical leak, namely, the power supply path of positive polarity or the power supply path of negative polarity.

In the second decision unit 23, only the DC component of the detection signal Vs is fetched by the low-pass filter 23a and the detection signal Vsd which has passed through the low-pass filter 23a is compared with the predetermined threshold values Vr2 and Vr3 by the first and second comparators 23b and 23c, respectively. When the detection signal Vsd has exceeded the threshold value Vr2 or Vr3, the decision signal $Vj2_1$ or $Vj2_2$ is outputted by judging that electrical leak occurs.

In the first embodiment, the first decision unit 22 is capable of detecting electrical leak occurring in the power supply path from the power supply device 10 to the load 2. On the other hand, in this embodiment, the second decision unit 23 is capable of detecting electrical leak occurring between the rectifier circuit 13 and the DC/AC conversion circuit 14 in the power supply device 10 as described above. Meanwhile, in this embodiment, since the output side of the DC/DC conversion circuit 19 is insulated from ground in terms of DC by providing the capacitor C0 in the same manner as the first embodiment, withstand voltage of the output side of the DC/DC conversion circuit 19 relative to ground can be raised and application of high voltage of the secondary winding of the insulated transformer 12 to the primary winding of the insulated transformer 12 is prevented, thereby resulting in enhancement of safety of the power supply device 10.

(Third Embodiment)

Figure 11:
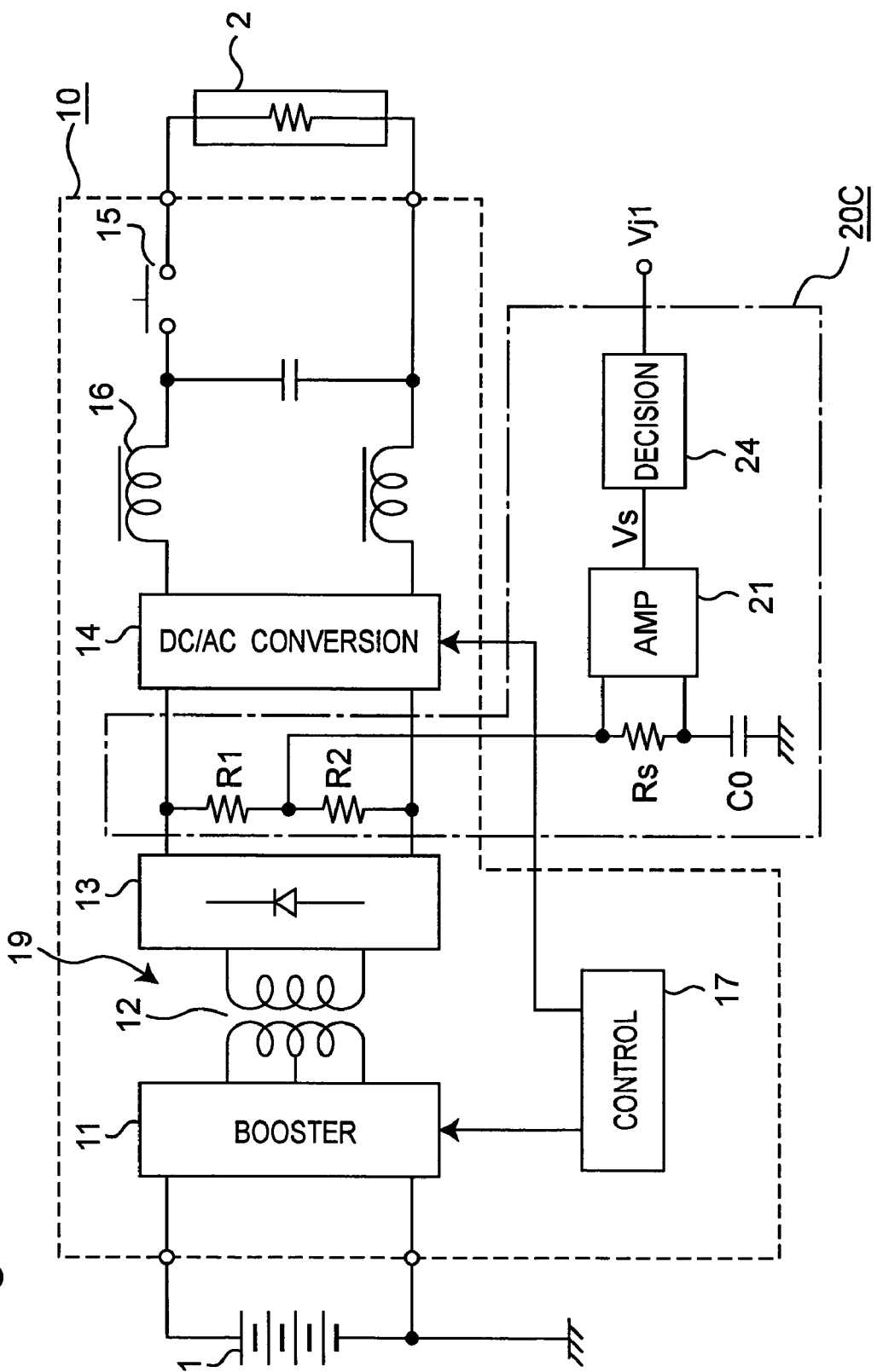
FIG. 11 is a block circuit diagram showing an electrical leak detecting apparatus according to a third embodiment of the present invention and the power supply device of FIG. 1.

FIG. 11 shows an electrical leak detecting apparatus 20C according to a third embodiment of the present invention, which is used for the power supply device 10. When the electrical leak detecting apparatus 20C is compared with the electrical leak detecting apparatus 20A of the first embodiment of the present invention, the first decision unit 22 of the electrical leak detecting apparatus 20A is replaced by a third decision unit 24. Since other configurations of the electrical leak detecting apparatus 20C are similar to those of the electrical leak detecting apparatus 20A of FIG. 1, the description is abbreviated for the sake of brevity.

Figure 12:
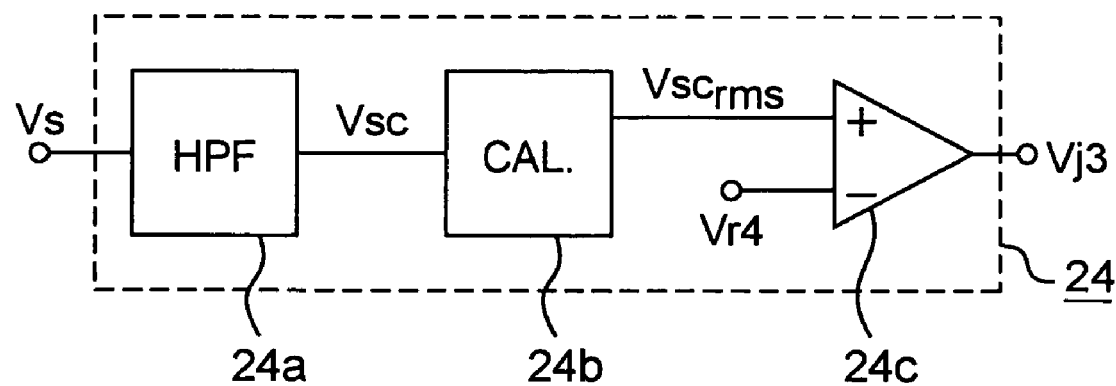
FIG. 12 is a block diagram of a third decision unit employed in the electrical leak detecting apparatus of FIG. 11.

As shown in FIG. 12, the third decision unit 24 includes a high-pass filter 24a for fetching only a frequency component equal to a chopping frequency included in the detection signal VS, i.e., a switching frequency in the booster circuit 11, a calculating portion 24b for calculating an effective value $Vsc_{rms}$ of a detection signal Vsc which has passed through the high-pass filter 24a and a comparator 24c for comparing the effective value $Vsc_{rms}$ from the calculating portion 24b with a predetermined threshold value Vr4. When the effective value $Vsc_{rms}$ of the detection value Vsc has exceeded the threshold value Vr4, a decision signal Vj3 is outputted by judging that electrical leak occurs.

Figure 13:
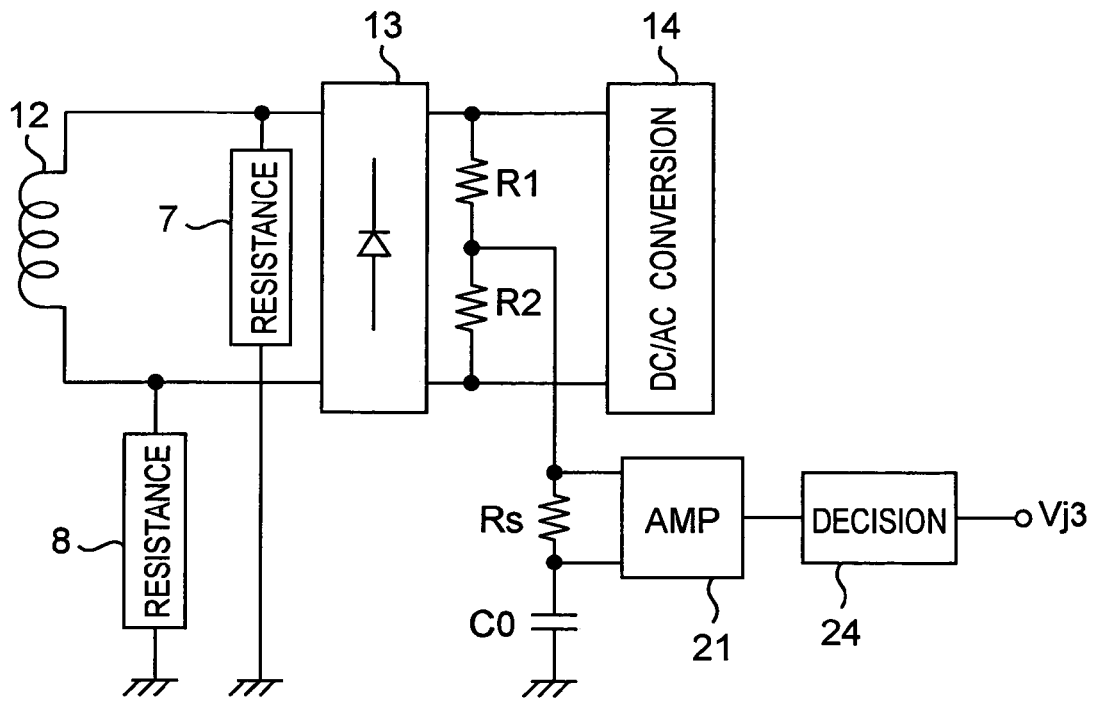
FIG. 13 is a view explanatory of operation of the third decision unit of FIG. 12.
Figure 14:
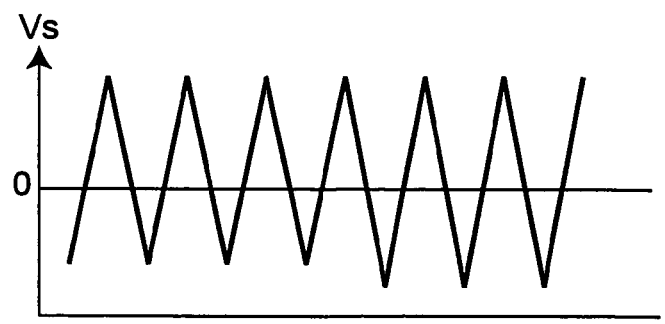
FIG. 14 is a waveform chart of the third decision unit of FIG. 12.

As shown in FIG. 13, a case is considered in which electrical leak due to dielectric breakdown (defective insulation) has occurred between the secondary winding of the insulated transformer 12 and the rectifier circuit 13 in the power supply device 10. In FIG. 13, reference numeral 7 denotes a dielectric breakdown resistance between a power supply path of positive polarity and ground, while reference numeral 8 denotes a dielectric breakdown resistance between a power supply path of negative polarity and ground. In this case, leakage current flows through the dielectric breakdown resistance 7 or 8, the detection resistance element Rs and the voltage division resistance element R1 or R2 via ground and the detection voltage Vs is generated across the detection resistance element Rs. At this time, as shown in FIG. 14, the detection voltage Vs becomes high-frequency voltage having a frequency substantially equal to the switching frequency for switching the switching element of the booster circuit 11.

In the third decision unit 24, only the frequency component substantially equal to the switching frequency in the booster circuit 11 is fetched from the detection signal Vs by the high-pass filter 24a and the effective value $Vsc_{rms}$ of the detection signal Vsc which has passed through the high-pass filter 24a is calculated by the calculating portion 24b. Then, the effective value $Vsc_{rms}$ of the detection signal Vsc, which has been calculated by the calculating portion 24b, is compared with the predetermined threshold value Vr4. When the effective value $Vsc_{rms}$ of the detection signal Vsc has exceeded the threshold value Vr4, the decision signal Vj3 is outputted by judging that electrical leak occurs. Meanwhile, if the frequency component fetched from the detection signal has a frequency substantially equal to the switching frequency in the booster circuit 11, it is possible to judge occurrence of electrical leak.

The first decision unit 22 of the first embodiment is capable of detecting electrical leak occurring in the power supply path from the power supply device 10 to the load 2, while the second decision unit 23 of the second embodiment is capable of detecting electrical leak occurring between the rectifier circuit 13 and the DC/AC conversion circuit 14 in the power supply device 10. On the other hand, in this embodiment, the third decision unit 24 is capable of detecting electrical leak occurring between the secondary winding of the insulated transformer 12 and the rectifier circuit 13 in the power supply device 10 as described above. Meanwhile, in this embodiment, since the output side of the DC/DC conversion circuit 19 is insulated from ground in terms of DC by inserting the capacitor C0 between the detection resistance element Rs and ground in the same manner as the first embodiment, withstand voltage of the output side of the DC/DC conversion circuit 19 relative to ground can be raised and application of high voltage of the secondary winding of the insulated transformer 12 to the primary winding of the insulated transformer 12 is prevented, thereby resulting in enhancement of safety of the power supply device 10.

(Fourth Embodiment)

Figure 15:
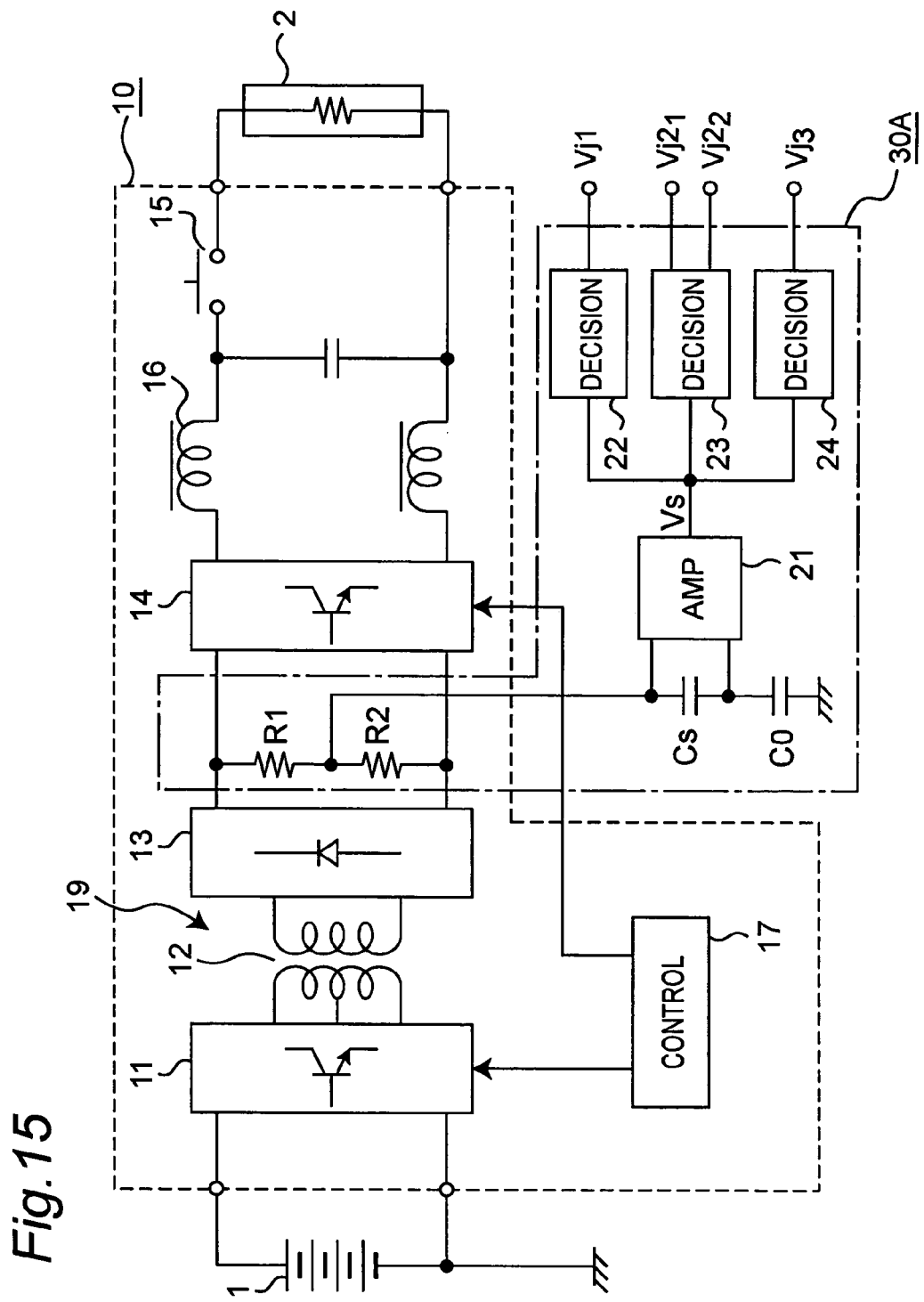
FIG. 15 is a block circuit diagram showing an electrical leak detecting apparatus according to a fourth embodiment of the present invention and the power supply device of FIG. 1.

FIG. 15 shows an electrical leak detecting apparatus 30A according to a fourth embodiment of the present invention, which is used for the power supply device 10. The electrical leak detecting apparatus 30A includes the first, second and third decision units 22, 23 and 24 in the first, second and third embodiments of the present invention, respectively. Since other configurations of the electrical leak detecting apparatus 30A are similar to those of the electrical leak detecting apparatus 20B of FIG. 7, the description is abbreviated for the sake of brevity. Thus, in the electrical leak detecting apparatus 30A, the capacitor Cs is used as the detection element.

Since the electrical leak detecting apparatus 30A includes the first, second and third decision units 22, 23 and 24, the electrical leak detecting apparatus 30A is capable of detecting electrical leak occurring at the different locations described in the first, second and third embodiments of the present invention, respectively. In other words, output of the decision signal Vji from the first decision unit 22 indicates that electrical leak occurs in the power supply path from the power supply device 10 to the load 2. Meanwhile, output of the decision signal $Vj2_1$ or $Vj2_2$ from the second decision unit 23 indicates that electrical leak occurs between the rectifier circuit 13 and the DC/AC conversion circuit 14 in the power supply device 10. Furthermore, output of the decision signal Vj3 from the third decision unit 24 indicates that electrical leak occurs between the secondary winding of the insulated transformer 12 and the rectifier circuit 13 in the power supply device 10.

Namely, since the electrical leak detecting apparatus 30A of this embodiment includes the first, second and third decision units 22, 23 and 24, the electrical leak detecting apparatus 30A is capable of detecting from decisions of the first, second and third decision units 22, 23 and 24 not only presence or absence of occurrence of electrical leak but the location of occurrence of electrical leak. In addition, when electrical leak has occurred at a plurality of locations simultaneously, the electrical leak detecting apparatus 30A is capable of detecting occurrence of these electrical leaks and the locations of occurrence of the electrical leaks concurrently. In this embodiment, all the first, second and third decision units 22, 23 and 24 are provided in the electrical leak detecting apparatus 30A by way of example. However, the electrical leak detecting apparatus 30A may include at least two of the first, second and third decision units 22, 23 and 24 as necessary.

(Fifth Embodiment)

Figure 16:
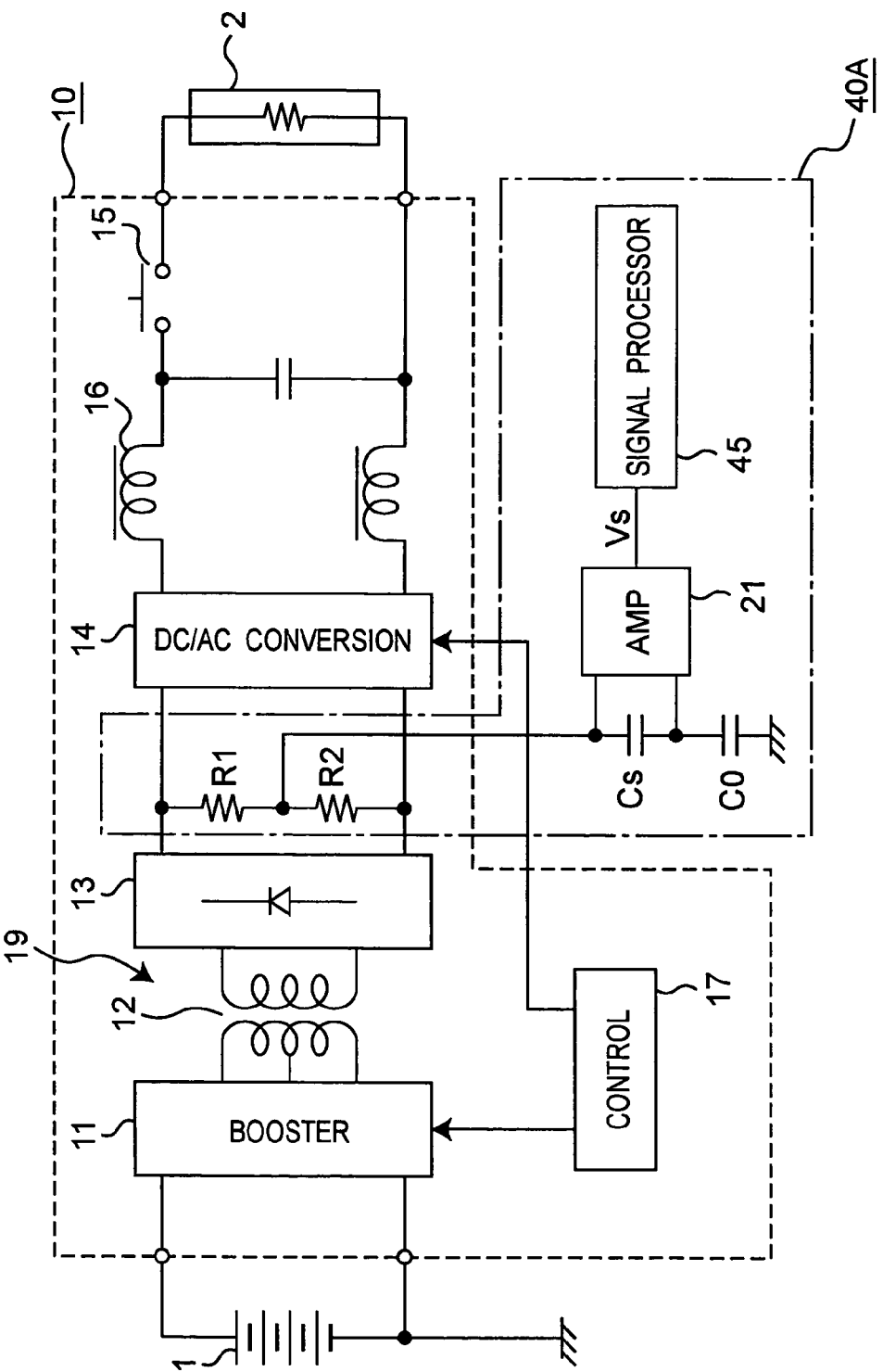
FIG. 16 is a block circuit diagram showing an electrical leak detecting apparatus according to a fifth embodiment of the present invention and the power supply device of FIG. 1.

FIG. 16 shows an electrical leak detecting apparatus 40A according to a fifth embodiment of the present invention, which is used for the power supply device 10. When the electrical leak detecting apparatus 40A is compared with the electrical leak detecting apparatus 20B of the second embodiment of the present invention, the second decision unit 23 of the electrical detecting apparatus 20B is replaced by a signal processor 45. Since other configurations of the electrical leak detecting apparatus 40A are similar to those of the electrical detecting apparatus 20B of FIG. 7, the description is abbreviated for the sake of brevity. Thus, in the electrical leak detecting apparatus 40A, the capacitor Cs is used as the detection element.

Figure 17:
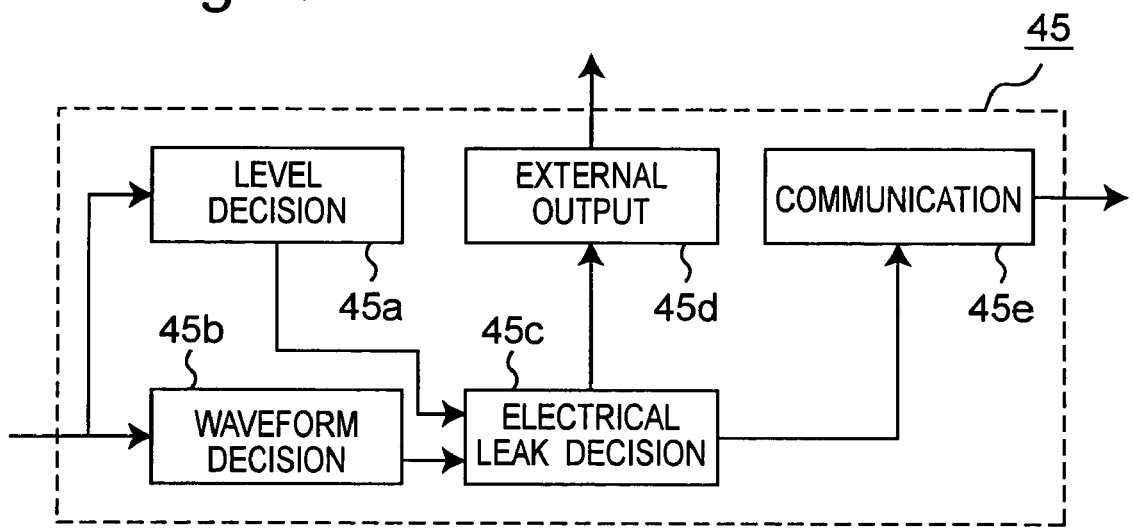
FIG. 17 is a block diagram of a signal processor employed in the electrical leak detecting apparatus of FIG. 16.

The signal processor 45 is mainly constituted by a microcomputer and includes a level decision unit 45a, a waveform decision unit 45b, an electrical leak decision unit 45c, an external output unit 45d and a communication unit 45e as shown in FIG. 17. The analog detection signal Vs amplified by the amplifier 21 is converted into a digital detection signal by utilizing an analog to digital (A/D) conversion function of the microcomputer and the digital detection signal is temporarily stored in a memory (not shown). The level decision unit 45a performs filtering and effective value calculation of the digital detection signal read from the memory so as to obtain a level of the detection signal Vs and compares the level of the detection signal Vs with a predetermined threshold value (reference data) so as to judge a level of leakage current. The waveform decision unit 45b obtains a waveform of the original detection signal Vs from the digital detection signal read from the memory and judges to which one of a plurality of preset waveform patterns (reference data) including the sine wave of FIG. 4 (the rectangular wave of FIG. 6 in case the power supply device 10 outputs AC voltage of rectangular wave), the linear waveform of FIGS. 10A and 10B and the saw-toothed waveform of FIG. 14 the obtained waveform is most approximate by such a method as pattern matching.

The electrical leak decision unit 45c judges presence or absence of occurrence of electrical leak from the leakage current level judged by the waveform decision unit 45a and judges a location of occurrence of electrical leak from the waveform decision of the waveform decision unit 45b. The electrical leak decision unit 45c outputs to the external output unit 45d and the communication unit 45e data indicative of occurrence of electrical leak and the location of occurrence of electrical leak. When the data has been inputted from the electrical leak decision unit 45c to the external output unit 45d, the external output unit 45d outputs to the power supply control circuit 17, etc. a control signal for adopting a measure suitable for the location of occurrence of electrical leak. For example, in case electrical leak occurs in the power supply path from the power supply device 10 to the load 2, the switch member 15 is opened as the measure. Meanwhile, in case electrical leak occurs in the power supply device 10, operation of the booster circuit 11 or the DC/AC conversion circuit 14 is stopped as the measure. Meanwhile, the communication unit 45e transmits, via a communication cable, to an electronic control unit (ECU) mounted on the motor vehicle the above mentioned data inputted from the electrical leak decision unit 45c. For example, Controller Area Network (CAN) which is stipulated as local area network (LAN) standards for motor vehicles may be used as a communication protocol of the communication unit 45e. Thus, if the communication unit 45e transmits the information on occurrence of electrical leak and the location of occurrence of electrical leak to the ECU and a driver of the motor vehicle is informed of the information by the ECU by the use of video, characters or audio, safety of the power supply device 10 is further enhanced.

Therefore, also in the electrical leak detecting apparatus 40A of this embodiment, it is possible to detect not only presence or absence of occurrence of electrical leak but the location of occurrence of electrical leak from a result of signal processing in the signal processor 45 in the same manner as the electrical leak detecting apparatus 30A of the fourth embodiment. In this embodiment, the waveform decision unit 45b performs three kinds of waveform decision corresponding to the first, second and third decision units 22, 23 and 24 of the electrical leak detecting apparatus 30A of FIG. 15, respectively but may also perform one or two kinds of the waveform decision. Meanwhile, if functions of the signal processor 45 are exercised by a microcomputer acting as the power supply control circuit 17 of the power supply device 10, circuit configurations of the electrical leak detecting apparatus 40A are simplified advantageously.

Meanwhile, in the above first to fifth embodiments, the voltage division resistance elements R1 and R2 are connected between the input terminals of the DC/AC conversion circuit 14 but electrical leak can be likewise detected even if the voltage division resistance elements R1 and R2 are connected between output terminals of the DC/AC conversion circuit 14. Furthermore, even if other impedance elements than the resistance elements, for example, capacitors are used as the voltage division elements and the detection element, the similar effects are gained. In case the capacitors are used as the voltage division elements and the detection element, the electrical leak detecting apparatus is insulated from the DC/DC conversion circuit 19 in terms of DC and DC does not flow through the voltage division elements (capacitors) normally, so that withstand voltage of the DC/DC conversion circuit 19 is improved advantageously. On the other hand, in case the voltage division resistance elements R1 and R2 and the detection resistance element Rs are employed, scatter of resistance values of the resistance elements R1, R2 and Rs is generally smaller than that of capacity values of the capacitors, so that output voltage of the DC/DC conversion circuit 19 can be advantageously detected quite accurately. Meanwhile, in case each of the two voltage division elements is formed by the resistance element, DC (dark current) flows through the two voltage division resistance elements R1 and R2 at all times and thus, power conversion efficiency of the power supply device 10 drops due to wasteful consumption of electric power. However, if at least one of the two voltage division elements is formed by a capacitor, DC does not normally flow through the capacitor acting as the voltage division element, so that wasteful consumption of electric power is restrained and thus, drop of power conversion efficiency of the power supply device 10 can be restrained.

(Sixth Embodiment)

Figure 18:
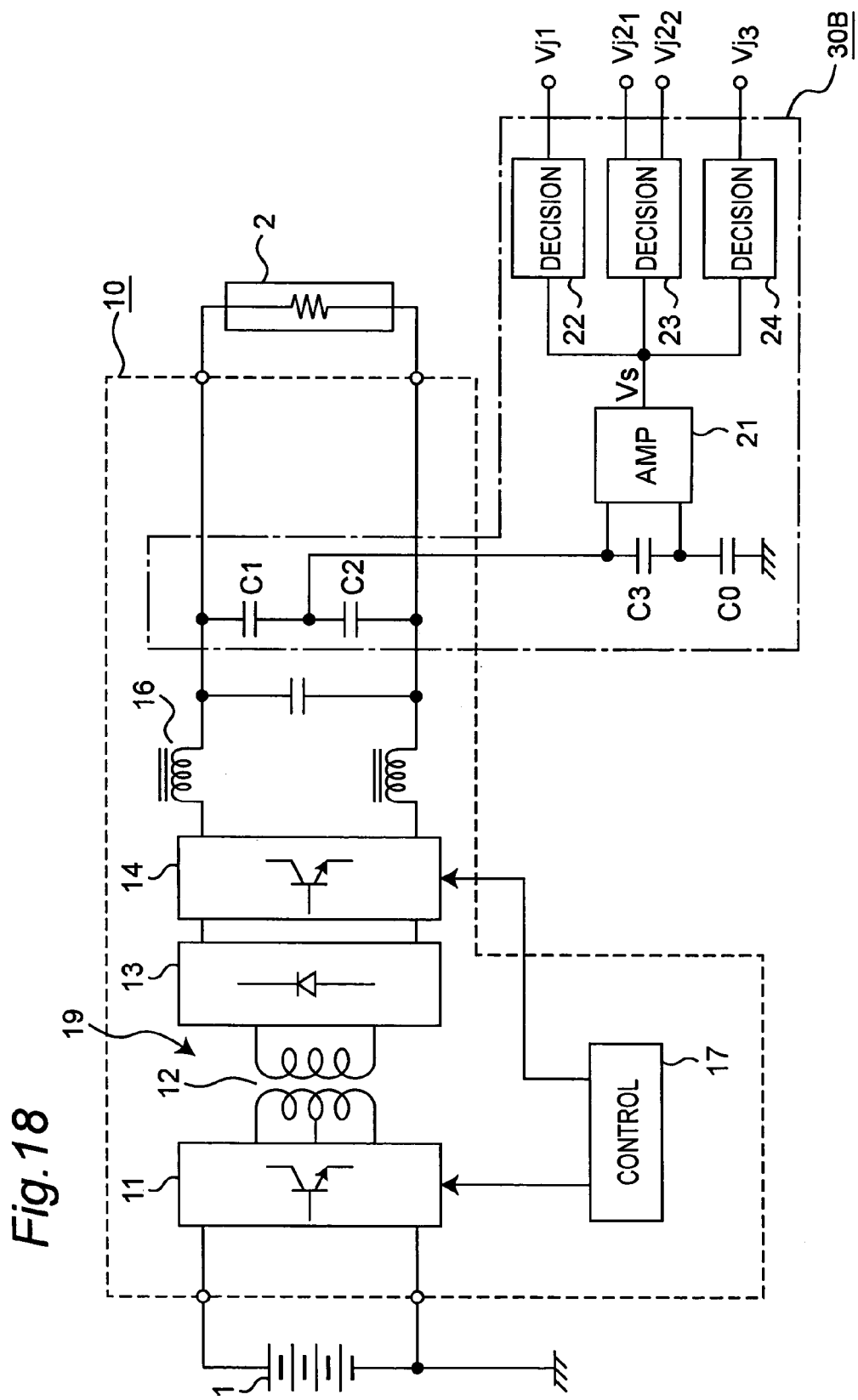
FIG. 18 is a block circuit diagram showing an electrical leak detecting apparatus according to a sixth embodiment of the present invention and the power supply device of FIG. 1.

FIG. 18 shows an electrical leak detecting apparatus 30B according to a sixth embodiment of the present invention, which is used for the power supply device 10 from which the switch member 15 of the power supply device 10 in the fourth embodiment of the present invention is deleted. When the electrical leak detecting apparatus 30B is compared with the electrical leak detecting apparatus 30A of the fourth embodiment of the present invention, the voltage division resistance elements R1 and R2 and the capacitor Cs of the electrical leak detecting apparatus 30A of FIG. 15 are, respectively, replaced by capacitors C1, C2 and C3 which form a filter circuit and the filter 16 and the filter circuit are disposed at an output side of the DC/AC conversion circuit 14. Since other configurations of the electrical leak detecting apparatus 30B are similar to those of the electrical leak detecting apparatus 30A of FIG. 15, the description is abbreviated for the sake of brevity. Thus, the electrical leak detecting apparatus 30B includes the first, second and third decision units 22, 23 and 24.

As shown in FIG. 18, the filter circuit is formed by the capacitors C1 and C2 connected to each other in series between the output terminals of the DC/AC conversion circuit 14 and the capacitor C3 inserted between a junction of the capacitors C1 and C2 and ground. This filter circuit is arranged to remove high-frequency noise leaking out of the power supply device 10 along an output line and serves to reduce noise of terminal voltage by stabilizing potential of the output line relative to ground.

Therefore, in this embodiment, high-frequency noise included in output of the DC/AC conversion circuit 14 can be removed by the capacitors C1 and C2 acting as the voltage division elements and the capacitor C3 acting as the detection element. In other words, since the voltage division elements and the detection element are also used as the filter circuit, such advantages as simplification of the circuit configuration and drop of the production cost can be achieved by reducing the number of the circuit elements.

(Seventh Embodiment)

Figure 19:
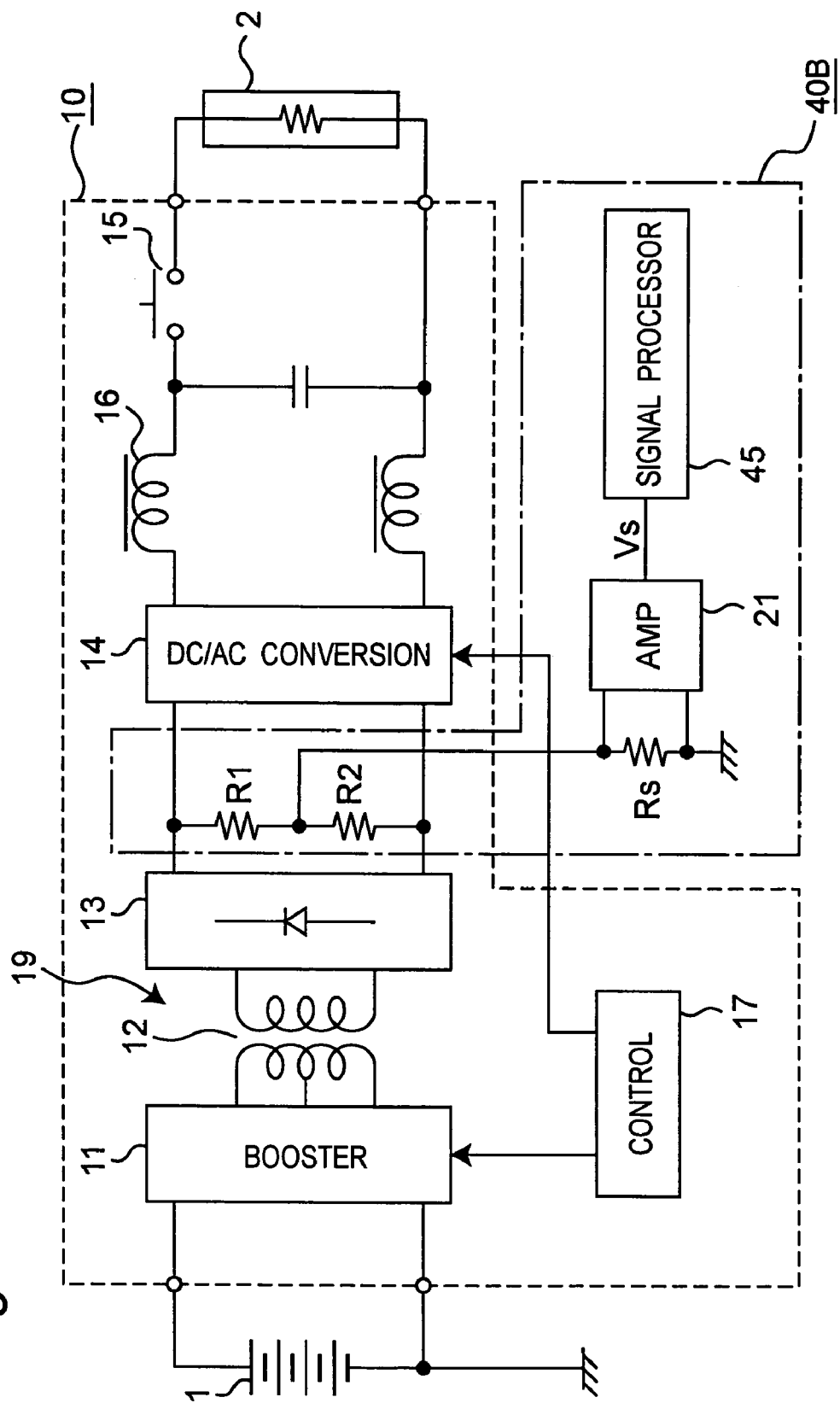
FIG. 19 is a block circuit diagram showing an electrical leak detecting apparatus according to a seventh embodiment of the present invention and the power supply device of FIG. 1.
Figure 20:
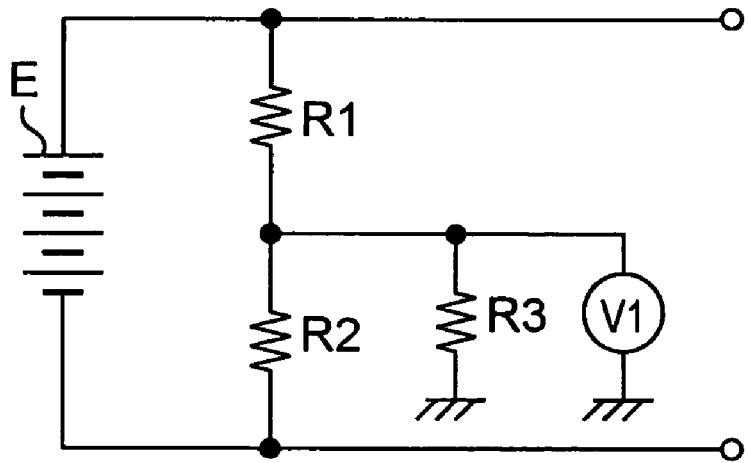
FIG. 20 is a circuit diagram of a prior art electrical leak detecting apparatus.
Figure 21:
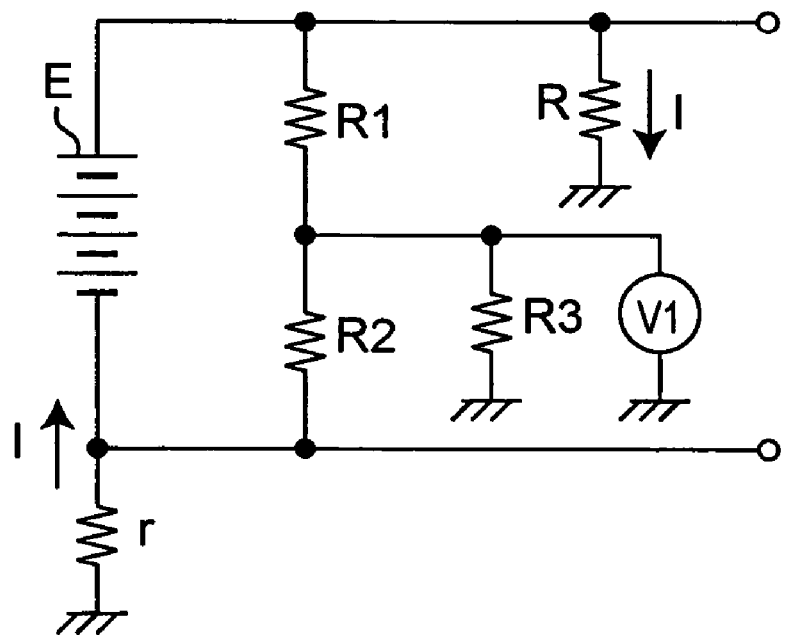
FIG. 21 is a circuit diagram explanatory of operation of the prior art electrical leak detecting apparatus of FIG. 20.

FIG. 19 shows an electrical leak detecting apparatus 40B according to a seventh embodiment of the present invention, which is used for the power supply device 10. When the electrical leak detecting apparatus 40B is compared with the electrical leak detecting apparatus 40A of the fifth embodiment of the present invention, the capacitor Cs of the electrical leak detecting apparatus 40A of FIG. 16 is replaced by the detection resistance element Rs and the capacitor C0 of the electrical leak detecting apparatus 40A of FIG. 16 is deleted. Since other configurations of the electrical leak detecting apparatus 40B are similar to those of the electrical leak detecting apparatus 40A, the description is abbreviated for the sake of brevity. Thus, the electrical leak detecting apparatus 40B includes the signal processor 45.

Also in the electrical leak detecting apparatus 40B of this embodiment, it is possible to detect not only presence or absence of occurrence of electrical leak but the location of occurrence of electrical leak from a result of signal processing in the signal processor 45 in the same manner as the electrical leak detecting apparatus 40A of the fifth embodiment.

Meanwhile, in the electrical leak detecting apparatus 40B of this embodiment, it is desirable to detect electrical leak in a no-load state of the power supply device 10 by opening the switch member 15 prior to start of power supply from the power supply device 10 to the load 2. Namely, if only the booster circuit 11 is operated in an open state of the switch member 15, it is possible to detect electrical leak in an interval from the insulated transformer 12 to the DC/AC conversion circuit 14 in the power supply device 10. Meanwhile, if the booster circuit 11 and the DC/AC conversion circuit 14 are operated in the open state of the switch member 15, it is possible to detect electrical leak in an interval from the DC/AC conversion circuit 14 to the switch member 15. If electrical leak is not detected in these initial checkups, such procedures may be taken in which a power supply path from the power supply device 10 to the load 2 is formed by closing the switch member 15 upon lapse of a predetermined waiting time and then, the power supply device 10 is operated by operating the booster circuit 11 and the DC/AC conversion circuit 14. By detecting electrical leak in the no-load state of the power supply device 10, occurrence of an electrical leak accident is prevented beforehand and thus, safety of the power supply device 10 is enhanced advantageously.

As is clear from the foregoing description, the following effects can be gained in the electrical leak detecting apparatus of the present invention. Initially, in, for example, the first embodiment, since the capacitor is inserted between the detection element and ground, the output side of the DC/DC conversion circuit is insulated from ground in terms of DC by the capacitor, so that withstand voltage of the output side of the DC/DC conversion circuit can be raised and high voltage of the secondary winding of the insulated transformer is not applied to the primary winding of the insulated transformer even if dielectric breakdown happens in the insulated transformer, thereby resulting in enhancement of safety of the power supply device.

Meanwhile, in the sixth embodiment, since at least one of the voltage division elements is formed by the capacitor, DC does not flow through the voltage division elements and thus, wasteful consumption of electric power can be prevented.

Moreover, in the fourth and sixth embodiments, since the decision means includes the first, second and third decision units, the decision means is capable of detecting electrical leak at the respective detection locations, so that the decision means is capable of detecting not only presence or absence of occurrence of electrical leak but the location of occurrence of electrical leak. In addition, when electrical leak has occurred at a plurality of the locations simultaneously, the decision means is capable of detecting occurrence of these electrical leaks and the locations of occurrence of the electrical leaks concurrently.

Furthermore, in the sixth embodiment, since the voltage division units and the detection element are formed by the capacitors, high-frequency noise included in output of the DC/AC conversion circuit can be removed by the capacitors.

The present disclosure relates to subject matter contained in Japanese Patent Application Nos. 2003-327388, filed on Nov. 11, 2002, and 2003-140991 and 2003-140992, both filed on May 19, 2003, the contents of all are herein expressly incorporated by reference in their entireties.

What is claimed is:

1. An electrical leak detecting apparatus that detects an electrical leak of a power supply device including a DC/DC conversion circuit in which a DC voltage supplied from a DC power supply is chopped and boosted to a desired level by an insulated transformer so as to be outputted through its rectification and smoothing and a DC/AC conversion circuit that converts the DC voltage outputted from the DC/DC conversion circuit into an AC voltage, the power supply device being operable electrically insulated from ground so as to supply the AC voltage to a load, the electrical leak detecting apparatus comprising:
   two voltage division elements which have an identical impedance value and which are connected to each other in series between one of input terminals and output terminals of the DC/AC conversion circuit;
   a detection element which has one end connected to a junction of the two voltage division elements;
   a capacitor which is inserted between an other end of the detection element and ground, that isolates the electrical leak detecting apparatus from ground;
   a decider which receives a voltage drop across the detection element as a detection signal and processes the detection signal to judge an occurrence of the electrical leak.

2. The electrical leak detecting apparatus as claimed in claim 1, wherein at least one of the voltage division elements is formed by a capacitor.

3. The electrical leak detecting apparatus as claimed in claim 1, wherein the decider includes a decision unit for judging an occurrence of the electrical leak in one zone by comparing an effective value of the AC voltage included in the detection signal with a predetermined threshold value and a further decision unit for judging occurrence of the electrical leak in a further zone by comparing an effective value of a frequency component equal to a chopping frequency included in the detection signal with a further predetermined threshold value.

4. The electrical leak detecting apparatus as claimed in claim 1, wherein the voltage division elements comprise a capacitor,
   wherein the decider includes
   at least one of a decision unit for detecting the electrical leak in one zone by comparing an effective value of the AC voltage included in the detection signal with a predetermined threshold value and a further decision unit for detecting the electrical leak in a further zone by comparing an effective value of a frequency component equal to a chopping frequency included in the detection signal with a further predetermined threshold value, and
   a still further decision unit for judging an occurrence of the electrical leak in a still further zone by comparing a DC component included in the detection signal with a still further predetermined threshold value corresponding to a polarity.

5. The electrical leak detecting apparatus as claimed in claim 1, wherein the voltage division elements are connected between the output terminals of the DC/AC conversion circuit and the voltage division elements and the detection elements each comprise a capacitor.

6. The electrical leak detecting apparatus as claimed in claim 1, further comprising;
   a communicator that transmits a decision result of the decider to an external component via a communication medium.

7. The electrical leak detecting apparatus as claimed in claim 3, further comprising;
   a communicator that transmits a decision result of the decider to an external component via a communication medium.

8. The electrical leak detecting apparatus as claimed in claim 4, further comprising;
   a communicator that transmits a decision result of the decider to an external component via a communication medium.

9. The electrical leak detecting apparatus as claimed in claim 1, further comprising:
   a switch member that one of opens and closes a power supply path from the DC/AC conversion circuit to the load;
   wherein the decider judges an occurrence of the electrical leak in a no-load state of the power supply device by opening the switch member prior to a start of a supply of power from the power supply device to the load.

10. The electrical leak detecting apparatus as claimed in claim 3, further comprising:
    a switch member for opening or closing a power supply path from the DC/AC conversion circuit to the load;
    wherein the decider judges an occurrence of the electrical leak in a no-load state of the power supply device by opening the switch member prior to start of power supply from the power supply device to the load.

11. The electrical leak detecting apparatus as claimed in claim 4, further comprising:
    a switch member for opening or closing a power supply path from the DC/AC conversion circuit to the load;
    wherein the decider judges an occurrence of the electrical leak in a no-load state of the power supply device by opening the switch member prior to start of power supply from the power supply device to the load.

* * * * *